US012538789B1

(12) United States Patent
Azeroual et al.

(10) Patent No.: US 12,538,789 B1
(45) Date of Patent: Jan. 27, 2026

(54) SHIELDED BALL-OUT AND VIA PATTERNS FOR LAND GRID ARRAY (LGA) DEVICES

(71) Applicant: Marvell Israel (M.I.S.L) Ltd., Yokneam (IL)

(72) Inventors: Dan Azeroual, Kiryat Ata (IL); Liav Ben Artsi, Nahariya (IL); David Katz, Hadera (IL)

(73) Assignee: Marvell Asia Pte Ltd, Singapore (SG)

( * ) Notice: Subject to any disclaimer, the term of this patent is extended or adjusted under 35 U.S.C. 154(b) by 518 days.

(21) Appl. No.: 18/179,406

(22) Filed: Mar. 7, 2023

Related U.S. Application Data

(63) Continuation-in-part of application No. 17/700,556, filed on Mar. 22, 2022.

(60) Provisional application No. 63/317,586, filed on Mar. 8, 2022, provisional application No. 63/164,360, filed on Mar. 22, 2021.

(51) Int. Cl.
| | | |
|---|---|---|
| *H01L 23/528* | (2006.01) | |
| *H01L 23/00* | (2006.01) | |
| *H01L 23/498* | (2006.01) | |
| *H01L 23/538* | (2006.01) | |
| *H05K 1/11* | (2006.01) | |
| *H05K 3/34* | (2006.01) | |

(52) U.S. Cl.
CPC ........ *H01L 23/5283* (2013.01); *H01L 23/498* (2013.01); *H01L 23/49811* (2013.01); *H01L 23/49816* (2013.01); *H01L 23/49822* (2013.01); *H01L 23/49827* (2013.01); *H01L 23/5383* (2013.01); *H01L 23/5384* (2013.01); *H01L 23/5386* (2013.01); *H01L 24/04* (2013.01); *H05K 1/113* (2013.01); *H05K 3/3436* (2013.01); *H01L 2224/0502* (2013.01); *H01L 2924/15* (2013.01)

(58) Field of Classification Search
CPC ......... H01L 23/49811; H01L 23/49816; H01L 23/49822; H01L 23/49827; H01L 23/5383; H01L 23/5384; H01L 23/5386
See application file for complete search history.

(56) References Cited

PUBLICATIONS

IEEE std. P802.3ck /D3.0, "Draft Standard for Ethernet—Amendment 4: Physical Layer Specifications and Management Parameters for 100 Gb/s, 200 Gb/s, and 400 Gb/s Electrical Interfaces Based on 100 Gb/s Signaling," IEEE Computer Society, pp. 1-323, Dec. 10, 2021.
IEEE std. P802.3dd /D3.0, "Draft Standard for Ethernet—Amendment 1: Maintenance #17: Power over Data Lines of Single Pair Ethernet," IEEE Computer Society, pp. 1-30, Jan. 11, 2022.
Ben Artsi et al., U.S. Appl. No. 17/700,556, filed Mar. 22, 2022.

*Primary Examiner* — Marcos D. Pizarro
(74) *Attorney, Agent, or Firm* — Meitar Patents Ltd.; Daniel Kligler

(57) ABSTRACT

An electronic network device includes a package substrate, an Integrated Circuit (IC) mounted on the package substrate, and a plurality of interconnection terminals disposed on a surface of the package substrate. The interconnection terminals include multiple pairs of signal terminals and multiple ground terminals. The interconnection terminals are arranged in a hexagonal grid in which (i) a given interconnection terminal is surrounded by six other interconnection terminals, and (ii) propagation paths between signal terminals that do not belong to a same pair are at least partially blocked by the ground terminals.

14 Claims, 5 Drawing Sheets

SHIELDED BALL-OUT AND VIA PATTERNS FOR LAND GRID ARRAY (LGA) DEVICES

CROSS-REFERENCE TO RELATED APPLICATIONS

This application claims the benefit of U.S. Provisional Patent Application 63/317,586, filed Mar. 8, 2022. This application is also a continuation-in-part of U.S. patent application Ser. No. 17/700,556, filed Mar. 22, 2022. The disclosures of these related applications are incorporated herein by reference.

FIELD OF THE DISCLOSURE

The present disclosure relates generally to Integrated Circuits (ICs), and particularly to methods and systems for interconnection between ICs and substrates.

BACKGROUND

Various interconnection techniques are used for connecting IC packages to Printed Circuit Boards (PCBs), The interconnection scheme is closely related to the packaging technology of the IC, Commonly used package technologies include Ball Grid Array (BGA), Land Grid Array (LGA) and Pin Grid Array (PGA).

The description above is presented as a general overview of related art in this field and should not be construed as an admission that any of the information it contains constitutes prior art against the present patent application.

SUMMARY

An embodiment that is described herein provides an electronic network device including a package substrate, an Integrated Circuit (IC) mounted on the package substrate, and a plurality of interconnection terminals disposed on a surface of the package substrate. The interconnection terminals include multiple pairs of signal terminals and multiple ground terminals. The interconnection terminals are arranged in a hexagonal grid in which (i) a given interconnection terminal is surrounded by six other interconnection terminals, and (ii) propagation paths between signal terminals that do not belong to a same pair are at least partially blocked by the ground terminals.

In an embodiment, the interconnection terminals include Land Grid Array (LGA) pads.

In some embodiments, the hexagonal grid includes multiple first subsets of interconnection terminals and multiple second subsets of interconnection terminals, each of the subsets extending along an axis of the hexagonal grid, the first subsets and the second subsets being interleaved with one another, the pairs of signal terminals being located only in the first subsets, and the second subsets including only ground terminals.

In an example embodiment, a given second subset of interconnection terminals is disposed between two of the first subsets of interconnection terminals. In a disclosed embodiment, the signal terminals in each pair are separated by a given pitch distance along the axis, and the first subsets are shifted relative to the second subsets, along the axis, by a half of the given pitch distance.

In some embodiments, the electronic network device further includes a Printed Circuit Board (PCB) configured to have the package substrate mounted thereon, directly or via a socket, the PCB including signal vias for connecting to the signal terminals, and ground vias for connecting to the ground terminals, wherein the ground vias are arranged in a pattern that deviates from the hexagonal grid. In an example embodiment, a deviation of the ground vias from the hexagonal grid defines, in the PCB, one or more clearance corridors that are clear of the ground vias, and the PCB further includes electrical traces that are connected to the signal vias and extend along the clearance corridors.

There is additionally provided, in accordance with an embodiment that is described herein, a method for producing an electronic network device. The method includes mounting an Integrated Circuit (IC) on a package substrate, and disposing a plurality of interconnection terminals on a surface of the package substrate. The interconnection terminals include (i) multiple pairs of signal terminals and (ii) multiple ground terminals. The interconnection terminals are arranged in a hexagonal grid in which (i) a given interconnection terminal is surrounded by six other interconnection terminals, and (ii) propagation paths between signal terminals that do not belong to a same pair are at least partially blocked by the ground terminals.

The present disclosure will be more fully understood from the following detailed description of the embodiments thereof, taken together with the drawings in which:

DETAILED DESCRIPTION OF EMBODIMENTS

Figure 1:
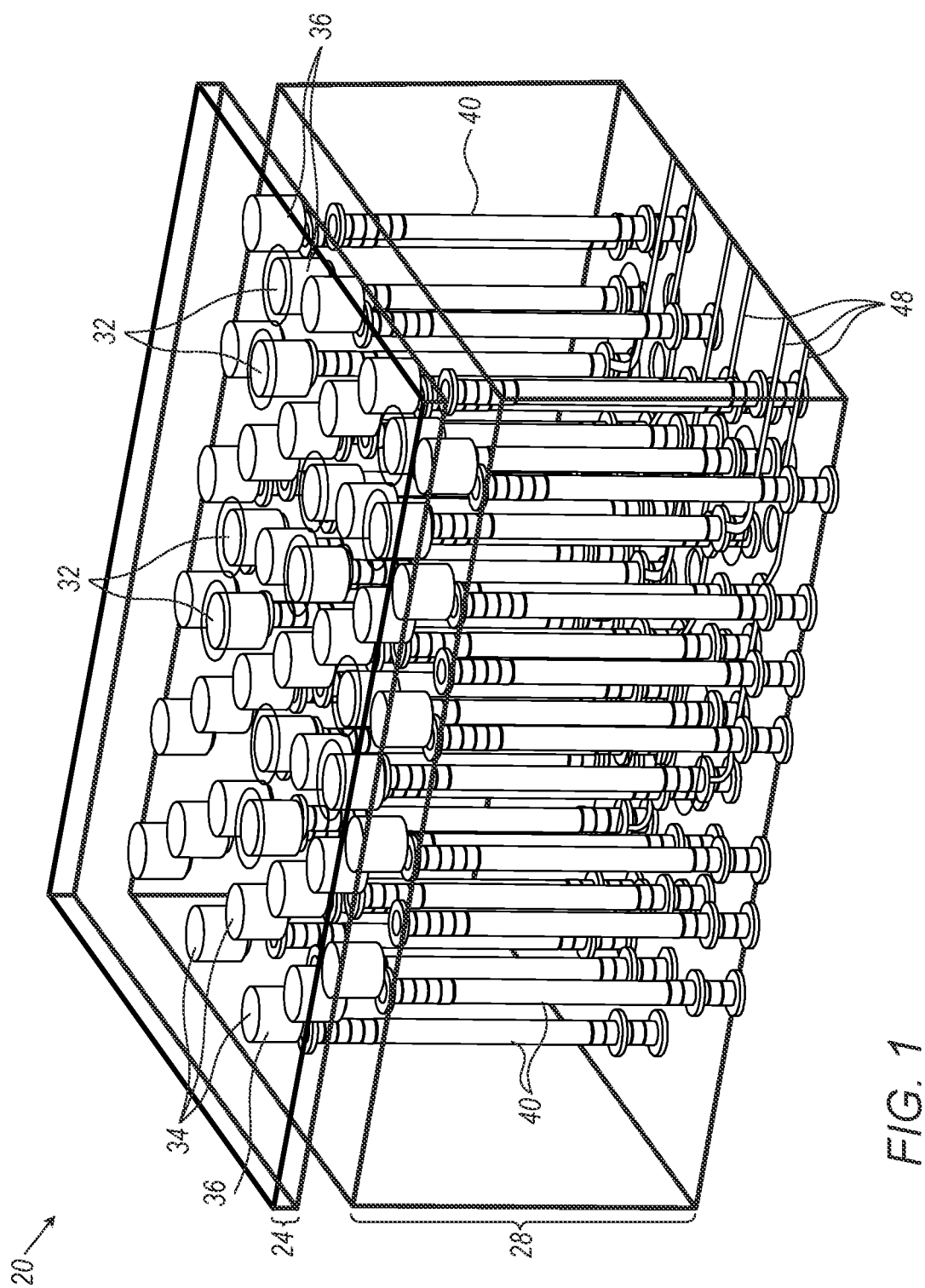
FIG. 1 is a schematic, pictorial illustration of an electronic device comprising an Integrated Circuit (IC) package mounted on a Printed Circuit Board (PCB), in accordance with an embodiment that is described herein.

High-speed electronic devices, such as Integrated Circuits (ICS) that implement network communication devices, typically communicate with other devices over multiple signal channels referred to as lanes. A lane typically comprises pair of interconnection terminals that convey a high-speed signal to or from the IC.

In designing a multi-lane IC, a package for the IC, and a PCB on which the package is to be mounted, various requirements axe typically considered. Requirements may include (i) design requirements, e.g., the footprint of the package and the specified data rate and signal integrity, (ii) and mechanical and fabrication process requirements, e.g., a minimal pitch (defined by a minimal center-to-center distance) between adjacent interconnection terminals. At high data rates, e.g., at or above 100 Gigabits per second (Gbps)

per lane, the device is prone to degraded signal integrity. Signal integrity may deteriorate, for example, due to undesired crosstalk between adjacent lanes, due t impedance discontinuity, and/or due to signal dispersion over frequency.

Embodiments that are described herein provide innovative layouts for interconnection terminals of high-speed IC packages, achieving a high degree of shielding between signals of different lanes. In some disclosed embodiments, an electronic network device comprises an Integrated Circuit (IC) mounted on a package substrate, and a plurality of interconnection terminals disposed on a surface of the package substrate. For brevity, the package substrate is also referred to herein as simply "substrate". The interconnection terminals comprise (i) multiple pairs of signal terminals, each pair corresponding to a respective lane, and (ii) multiple ground terminals.

In disclosed embodiments, the interconnection terminals are arranged in a repetitive hexagonal grid. In the present context, the term "hexagonal grid" refers to a grid of hexagons in which interconnection terminals are placed both at the centers of the hexagons and at the vertices of the hexagons. In such a grid, a given interconnection terminal is surrounded by six other interconnection terminals. Pairs of signal terminals are placed in alternating columns of the hexagonal grid, with each pair being surrounded by eight ground terminals. As will be shown below, this layout ensures that electromagnetic propagation paths between signal terminals that do not belong to the same pair (and thus do not belong to the same lane) are at least partially blocked by the ground terminals. As a result, crosstalk between lanes is reduced considerably.

In some embodiments, the IC is packaged in a Land Grid Array (LGA) package, and the interconnection terminals comprise LGA pads or pins. In other embodiments, other package types and other types of interconnection terminals can be used. For example, the IC may be packaged in a Ball Grid Array (BGA) or a Pin Grid Array (PGA) package. The interconnection terminals may comprise pads, pins, balls, springs, or any other suitable interconnection type.

In some embodiments, the electronic network device further comprises a Printed Circuit Board (PCB), on which the IC package is mounted. Mounting may be direct, e.g., using reflow soldering or by mechanical pressure, or indirect using a socket. The PCB typically comprises signal vias for connecting to the signal terminals of the IC package, and ground vias for connecting to the ground terminals of the IC package.

In some embodiments, the layout of vias in the PCB deviates from the hexagonal-grid layout of the IC package's interconnection terminals. The purpose of the deviation is to create "clearance corridors", i.e., stripes in the layers of the PCB that are free of vias. The clearance corridors are used for routing of circuit traces that connect to the signal vias and ground vias.

In an embodiment, the pitch of the signal vias as well as the number of surrounding ground vias are further optimized in the suggested pattern to match the target impedance of around 90 Ohms and thus reduce impedance discontinuity. In an embodiment, to further reduce impedance discontinuity, the ground layers below and above the clearance corridors have continuous ground planes having no openings or voids.

Various implementation examples of the disclosed techniques are described herein. In some embodiments, the disclosed techniques are used to implement a large IGA device comprising multiple 100 Gbps signal lanes, using 0.9 mm pitch and with very low crosstalk, Simulated Far-End Crosstalk (FEXT) and Near-End Crosstalk (NEXT) performance for such a device is presented.

FIG. 1 is a schematic, pictorial illustration of an electronic device 20, in accordance with an embodiment that is described herein. Device 20 comprises a packaged Integrated Circuit (IC) mounted on a package substrate 24. FIG. 1 shows substrate 24 but not the actual IC die, for the sake of clarity.

The packaged IC is mounted on a PCB 28. PCB 28 typically comprises one or more trace-routing layers and one or more shielding layers (also referred to as ground layers), In an embodiment, the trace-routing layers and shielding layers are interleaved, with adjacent layers being separated from one another by dielectric.

In the present example, the IC is packaged in a LGA package. In an embodiment, the IC comprises a network device, such as an Ethernet switch. PCB 28 is configured to conduct signals between the IC and other electrical components (not Shown). In most practical implementations, PCB 28 is used for mounting multiple ICs, in which case FIG. 1 presents only a relevant region of the PCB, for the sake of clarity.

In some embodiments, multiple interconnection terminals are disposed on a surface of package substrate 24. In the present example, the interconnection terminals comprise signal terminals 32 and ground terminals 34. Terminals 32 and 34 are disposed on the bottom surface of substrate 24 (the term "bottom" refers, for ease of explanation and without loss of generality, to the orientation of FIG. 1). Signal terminals 32 are arranged in pairs, each pair conveying a respective signal as part of a respective lane. Each lane is used for transferring a 100 Gbps differential signal between IC 24 and substrate 28. Ground terminals 34 are used for electromagnetic shielding between pairs of signal terminals 32, so as to reduce crosstalk between lanes.

In some embodiments, terminals 32 and 34 are arranged in a repetitive hexagonal grid in which each terminal is surrounded by six other terminals. In this arrangement, pairs of signal terminals 32 are placed in alternating columns of the hexagonal grid, with each pair of signal terminals 32 being surrounded by eight ground terminals 34. With this layout, propagation paths between signal terminals 32 that do not belong to the same pair are at least partially blocked by ground terminals 34.

In the present example, the interconnection terminals (signal terminals 32 and ground terminals 34) are implemented as pads on the surface of package substrate 24. PCB 28 has a plurality of pins 36 mounted thereon, each pin 36 of PCB 28 facing a corresponding terminal (32 or 34) of substrate 24. Pins 36 are thus arranged in a hexagonal grid, similarly to terminals 32 and 34.

In an alternative embodiment, balls are disposed on PCB 28 instead of pins 36. In another embodiment, springs are disposed on PCB 28 instead of pins 36. In yet other embodiments, the interconnection terminals of substrate 24 (signal terminals 32 and ground terminals 34) are implemented as pins, balls or springs. In these embodiments, PCB 28 has pads disposed thereon for connecting to the interconnection terminals of substrate 24.

In the embodiment of FIG. 1, PCB 28 comprises multiple vias 40 formed therethrough. Vias 40 extend from the top surface to the bottom surface of PCB 28 (here, too, the terms "top" and "bottom" refer, for ease of explanation and without loss of generality, to the orientation of FIG. 1). The top ends of vias 40 are used for connecting to pins 36 (or otherwise to interconnection terminals 32 and 34 of package substrate 24). The bottom ends of vias 40 are used for connecting to electrical traces 48 disposed in one or more layers of PCB 28.

As will be discussed below, in some embodiments vias 40 are arranged in a layout that is different from the hexagonal layout of pins 36 (and of terminals 32 and 34). The layout of vias 40 is designed to form "clearance corridors" in the any of the trace-routing layers of PCB 28. The clearance corridors are used for routing traces 48. Vias 40 comprise (i) signal vias for connecting to signal terminals 32 (through some of pins 36), and (ii) ground vias for connecting to ground terminals 34 (through some of pins 36).

In the context of the present disclosure and in the claims, the term "connecting" and its grammatical variations is used for describing a structure of two or more elements arranged, linked, or assembled in a way to transfer electrical current therebetween.

The configuration of electronic device 20, as shown in FIG. 1, is depicted solely by way of example. In alternative embodiments, other suitable configurations can also be used. For example, a socket may be placed between PCB 28 and package substrate 24. Typically, the socket is mechanically assembled on PCB 28, and the IC package is inserted into the socket. The socket typically comprises multiple socket terminals for connecting terminal 32 and 34 of IC 40 to vias 40 of PCB 28. The socket terminals are typically arranged in a hexagonal grid, facing the hexagonal grid of terminals 32 and 34.

Figure 2:
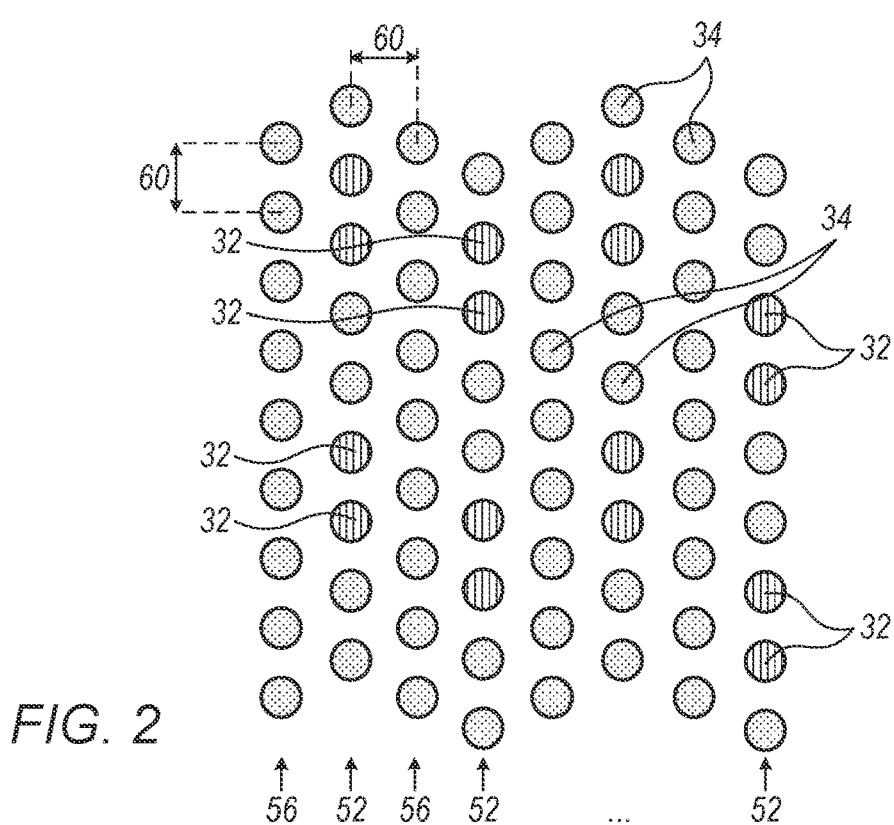
FIG. 2 is a schematic layout of interconnection terminals formed on a surface of a package substrate in the electronic device of FIG. 1, in accordance with an embodiment that is described herein.

FIG. 2 schematic layout of the is a interconnection terminals on the surface of substrate 24, including signal terminals 32 and ground terminals 34, in accordance with an embodiment that is described herein.

As seen, the interconnection terminals are arranged in a hexagonal grid. With the exception of the edges of the substrate, each terminal (32 or 34): is placed at the center of a hexagon, with six other terminals (32 or 34) being placed at the vertices of the hexagon.

Put in another way, the hexagonal grid comprises alternating columns 52 and 56 (the term "column" refers, for ease of explanation and without loss of generality, to the orientation of FIG. 2). Columns 52 and 56 are also referred to as subsets of interconnection terminals. Columns 52 and 56 are parallel to one another and extend along an axis of the grid. A pitch 60 (also referred to as "column pitch distance") of the hexagonal grid can be defined as either (i) the distance between adjacent columns, or (ii) the distance between adjacent terminals in a given column. Columns 52 are shifted relative to columns 56, along the axis in question, by half of the pitch. In the present example pitch 60 is 900 μm (0.9 mm). Alternatively, however, any other suitable pitch can be used.

In the present embodiment, signal terminals 32 are located only in columns 52 and not in columns 56. Columns 52 comprise both signal terminals 32 and ground terminals 34. Columns 56 comprise only ground terminals 34. Signal terminals 32 are arranged in pairs, each pair placed in a certain column 52. Each pair of signal terminals 32 is surrounded by ground terminals 34.

With the layout of FIG. 2, any signal propagation path (e.g., any straight "line-of-sight") between signal terminals 32 that do not belong to the same pair is blocked (at least partially) by one or more ground terminals 34. Consequently, crosstalk between pairs of signal terminals is very low. Example numerical values of crosstalk can be seen in FIGS. 7 and 8 below.

Figure 3:
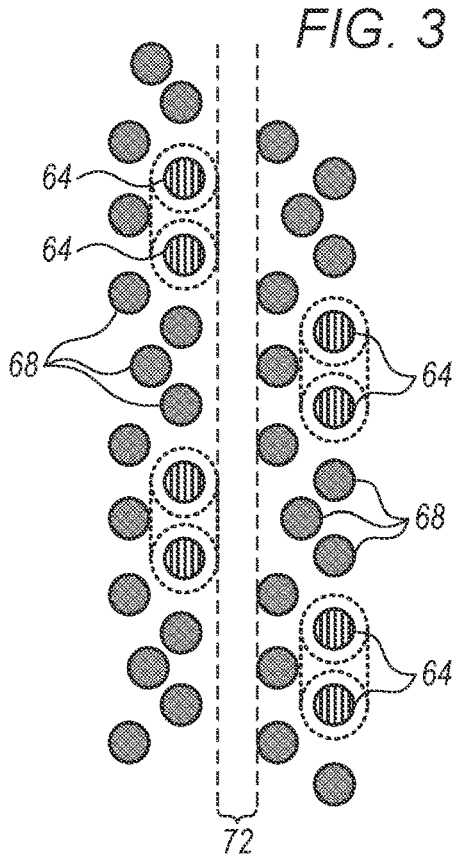
FIG. 3 is a schematic layout of ground vias and signal vias formed in the PCB for mounting the package substrate, in accordance with an embodiment that is described herein.

FIG. 3 is a schematic layout of signal vias 64 and ground vias 68 formed on PCB 28 for mounting package substrate 24, in accordance with an embodiment that is described herein. Signal vias 64 and ground vias 68 together make up the overall set of vias 40 seen in FIG. 1 above.

As seen (e.g., by comparing FIG. 3 to FIG. 2 above), the layout of signal vias 64 and ground vias 68 (in PCB 28) differs from the layout of signal terminals 32 and ground terminals 34 (of substrate 24 of the packaged IC). The layout of vias 64 and 68 (FIG. 3) deviates from the hexagonal grid of signal terminals 32 and ground terminals 34 (FIG. 2).

Figure 6:
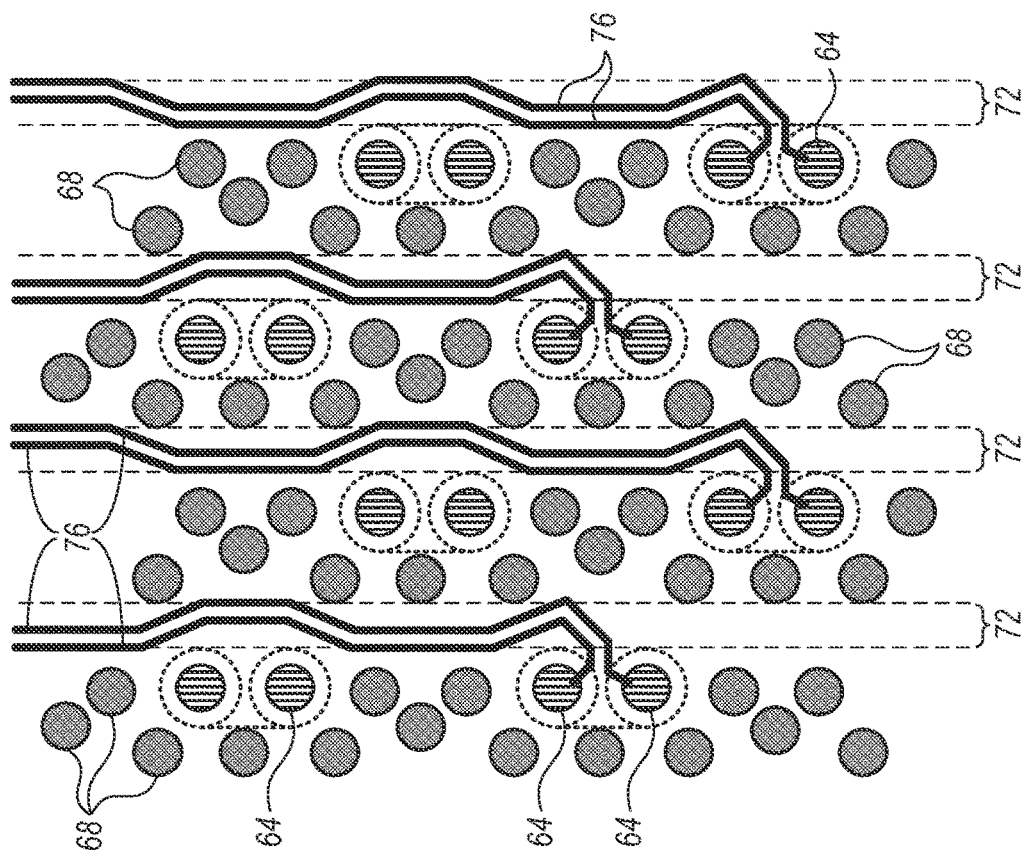
FIG. 6 is a schematic layout showing routing of electrical traces in the PCB, in accordance with an embodiment that is described herein.

In an embodiment, the deviation the from hexagonal pattern creates one more "clearance Corridors" 72 in PCB 28. Corridors 72 are free of vias and can be used for routing of electrical traces. Example routing is seen in FIG. 6 below. Keeping the clearance corridors free of vias has little or no effect on shielding performance.

Figure 4:
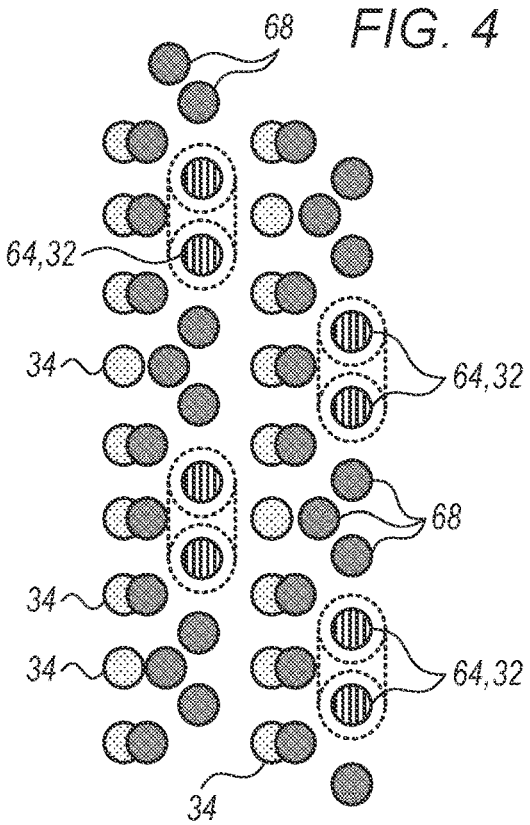
FIGS. 4 and 5 are schematic layouts, each showing both the interconnection terminals of the package substrate, and the signal vias and ground vias of the PCB, in accordance with an embodiment that is described herein.

FIG. 4 is a schematic layout showing both the interconnection terminals of substrate 24, and the vias of PCB 28, in accordance with an embodiment that is described herein. The present figure is constructed by overlaying the hexagonal layout of interconnection terminals 32 and 34 (FIG. 2) and the layout of vias 64 and 68 (FIG. 3).

Dashed lines in FIG. 4 illustrate voids (also referred to as "anti-pads") in one or more shielding layers in PCB 28. As noted above, the shielding layers are typically located above and below the trace-routing layers of PCB 28. The anti-pads are also seen in FIGS. 5 and 6 below.

FIG. 4 demonstrates the difference between the two layouts, explained above. The figure also demonstrates the density with which signal vias 64 are surrounded (and thus shielded) by ground vias 68. Simulated crosstalk performance of this arrangement is given in FIGS. 7 and 8 below.

Figure 5:
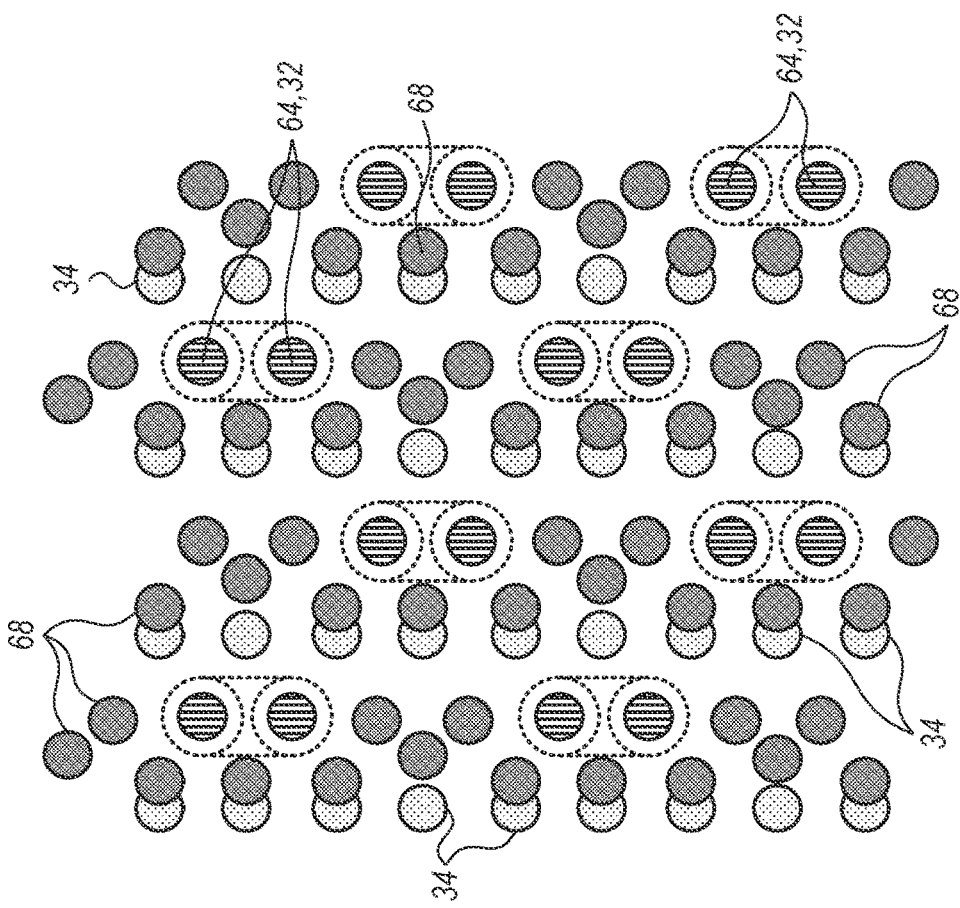

FIG. 5 is a schematic layout showing both the interconnection terminals of package substrate 24, and the vias of PCB 28, in accordance with an embodiment that is described herein. The present figure repeats the layout of FIG. 4 over a larger area of substrate 24 and PCB 28, FIG. 6 is a schematic layout showing routing of pairs of electrical traces 76 in PCB 28, in accordance with an embodiment that is described herein. Traces 76 (corresponding to traces 48 of FIG. 1) connect to signal vias 64, for transferring signals to and/or from the signal vias. As noted above, each pair of traces 76 correspond to a respective lane. The figure demonstrates the use of clearance corridors 72 for routing traces 76.

The layouts of the various interconnection terminals, vias and traces, shown in FIGS. 2-6, are example layouts that are depicted solely for the sake of conceptual clarity. In alternative embodiments, any other suitable layouts can be used.

Figure 7:
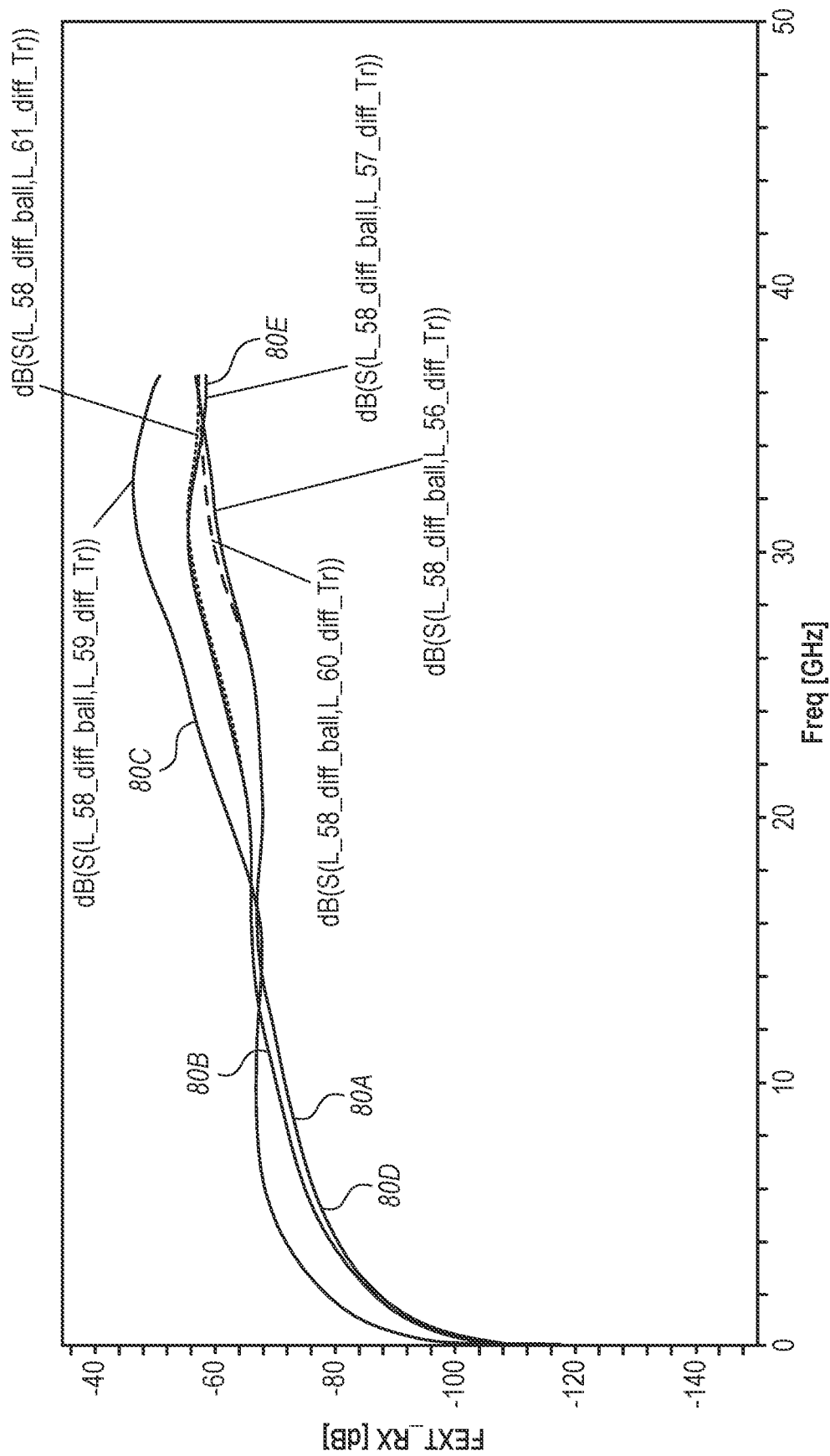
FIGS. 7 and 8 are graphs showing simulated Far-End Crosstalk (FEXT) and Near-End Crosstalk (NEXT) performance of the electronic device of FIG. 1, respectively, in accordance with an embodiment that is described herein.
Figure 8:
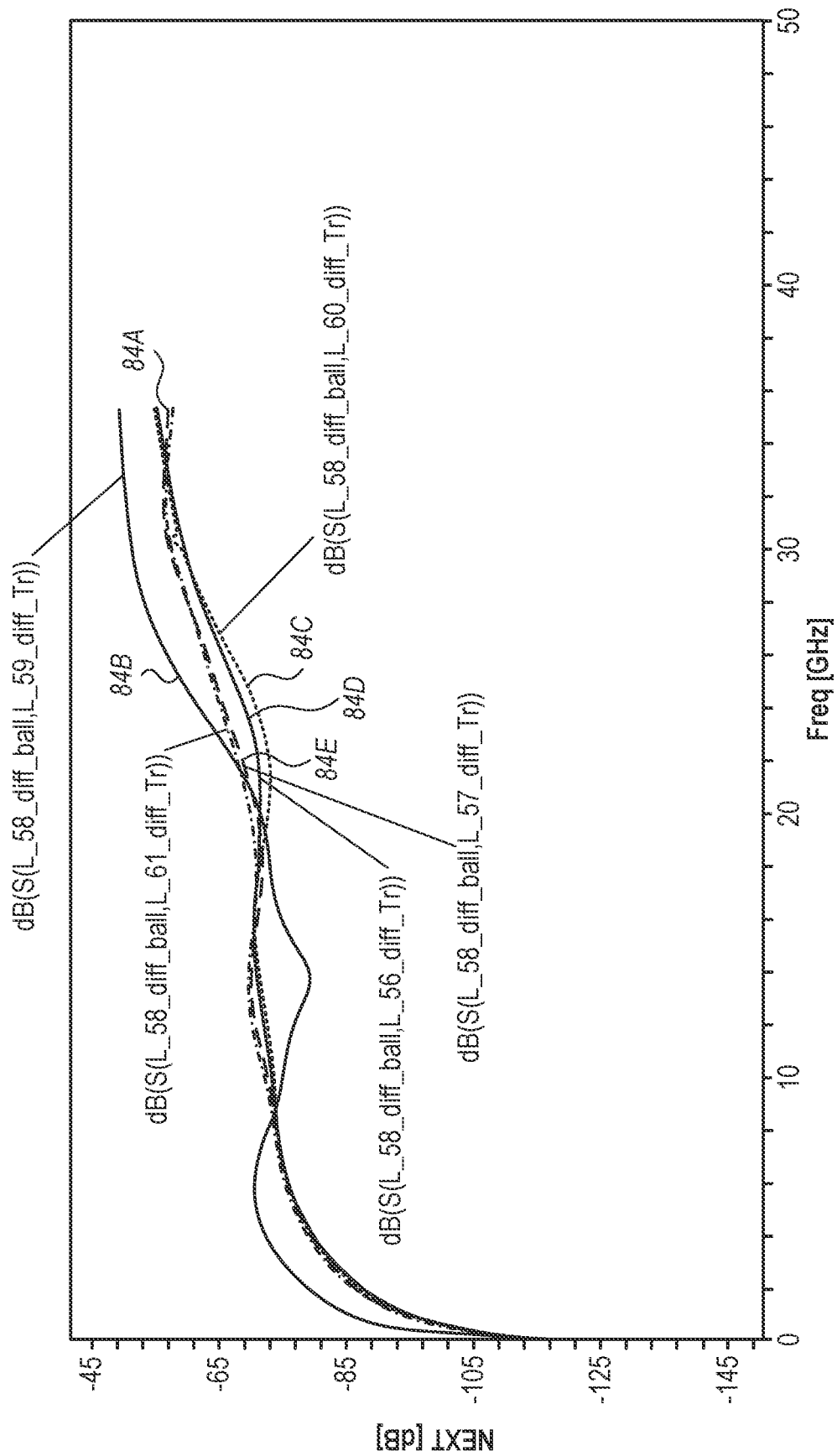

FIGS. 7 and 8 are graphs showing simulated crosstalk performance of electronic device 20, in accordance with an embodiment that is described herein. FIG. 7 includes simulated curves 80A-80E that plot Far-End Crosstalk (FEXT) between lanes as a function of frequency. FIG. 8 includes simulated curves 84A-84D that plot Near-End Crosstalk (NEXT) between lanes as function of frequency. The crosstalk values depicted in curves 84A-84D may be of interest at any of the depicted frequencies, depending on the nature of the signal passing through the break-out traces (e.g., traces 76 of FIG. 6). In a possible embodiment, the signals are of broadband characteristics and accordingly include frequency content over all or most of the depicted graphs on FIGS. 7 and 8. As seen, even the worst-case crosstalk is better than −50 dB at frequencies up to Fb/2 (26.5625 GHz for 100 Gbps PAM4).

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic network device, comprising:
   a package substrate;
   an Integrated Circuit (IC) mounted on the package substrate; and
   a plurality of interconnection terminals disposed on a surface of the package substrate, the interconnection terminals comprising (i) multiple pairs of signal terminals and (ii) multiple ground terminals, the interconnection terminals being arranged in a hexagonal grid in which (i) a given interconnection terminal is surrounded by six other interconnection terminals, and (ii) propagation paths between signal terminals that do not belong to a same pair are at least partially blocked by the ground terminals.

2. The electronic network device according to claim 1, wherein the interconnection terminals comprise Land Grid Array (LGA) pads.

3. The electronic network device according to claim 1, further comprising a Printed Circuit Board (PCB) configured to have the package substrate mounted thereon, directly or via a socket, the PCB comprising signal vias for connecting to the signal terminals, and ground vias for connecting to the ground terminals, wherein the ground vias are arranged in a pattern that deviates from the hexagonal grid.

4. The electronic network device according to claim 3,
   wherein a deviation of the ground vias from the hexagonal grid defines, in the PCB, one or more clearance corridors that are clear of the ground vias,
   and wherein the PCB further comprises electrical traces that are connected to the signal vias and extend along the clearance corridors.

5. The electronic network device according to claim 1,
   wherein the hexagonal grid comprises multiple first subsets of interconnection terminals and multiple second subsets of interconnection terminals, each of the subsets extending along an axis of the hexagonal grid, the first subsets and the second subsets being interleaved with one another; and
   wherein the pairs of signal terminals are located only in the first subsets, and wherein the second subsets comprise only ground terminals.

6. The electronic network device according to claim 5, wherein a given second subset of interconnection terminals is disposed between two of the first subsets of interconnection terminals.

7. The electronic network device according to claim 5, wherein the signal terminals in each pair are separated by a given pitch distance along the axis, and wherein the first subsets are shifted relative to the second subsets, along the axis, by a half of the given pitch distance.

8. A method for producing an electronic network device, the method comprising:
   mounting an Integrated Circuit (IC) on a package substrate; and
   disposing a plurality of interconnection terminals on a surface of the package substrate, the interconnection terminals comprising (i) multiple pairs of signal terminals and (ii) multiple ground terminals, the interconnection terminals being arranged in a hexagonal grid in which (i) a given interconnection terminal is surrounded by six other interconnection terminals, and (ii) propagation paths between signal terminals that do not belong to a same pair are at least partially blocked by the ground terminals.

9. The method device according to claim 8, wherein disposing the interconnection terminals comprises disposing Land Grid Array (LGA) pads.

10. The method according to claim 8, further comprising mounting the package substrate on a Printed Circuit Board (PCB), directly or via a socket, the PCB comprising signal vias for connecting to the signal terminals, and ground vias for connecting to the ground terminals, wherein the ground vias are arranged in a pattern that deviates from the hexagonal grid.

11. The method according to claim 10,
    wherein a deviation of the ground vias from the hexagonal grid defines, in the PCB, one or more clearance corridors that are clear of the ground vias,
    and wherein the PCB further comprises electrical traces that are connected to the signal vias and extend along the clearance corridors.

12. The method according to claim 5,
    wherein the hexagonal grid comprises multiple first subsets of interconnection terminals and multiple second subsets of interconnection terminals, each of the subsets extending along an axis of the hexagonal grid, the first subsets and the second subsets being interleaved with one another; and
    wherein disposing the interconnection terminals comprises disposing the pairs of signal terminals only in the first subsets, and disposing only ground terminals in the second subsets.

13. The method according to claim 12, wherein disposing the interconnection terminals comprises disposing a given second subset of interconnection terminals between two of the first subsets of interconnection terminals.

14. The method according to claim 12, wherein the signal terminals in each pair are separated by a given pitch distance along the axis, and wherein the first subsets are shifted relative to the second subsets, along the axis, by a half of the given pitch distance.

* * * * *